United States Patent [19]

Stolz et al.

[11] 4,451,754
[45] May 29, 1984

[54] HIGH FREQUENCY PIEZOELECTRIC RESONATOR

[75] Inventors: Silvano Stolz, Bienne; Raymond Huguenin, Preles, both of Switzerland

[73] Assignee: Dryan-Fordahl Technologies S.A., Bienne, Switzerland

[21] Appl. No.: 90,842

[22] Filed: Nov. 2, 1979

[30] Foreign Application Priority Data

Nov. 16, 1978 [FR] France ............................. 78 33350

[51] Int. Cl.³ ............................................. H01L 41/08
[52] U.S. Cl. .................... 310/348; 310/344; 310/368; 310/346
[58] Field of Search ............... 310/367, 368, 344, 320, 310/346, 348, 361

[56] References Cited

U.S. PATENT DOCUMENTS

| 3,339,091 | 8/1967 | Hammond et al. | 310/9.1 |
|---|---|---|---|
| 3,617,780 | 11/1971 | Benjaminson | 310/361 X |
| 3,745,385 | 7/1973 | Nakajima et al. | 310/367 X |
| 4,035,674 | 7/1977 | Oguchi et al. | 310/320 |
| 4,216,462 | 8/1980 | Engdahl | 310/320 |

FOREIGN PATENT DOCUMENTS

| 2455465 | of 0000 | Fed. Rep. of Germany . | |
|---|---|---|---|
| 2703335 | 4/1977 | Fed. Rep. of Germany | 310/361 |
| 2702106 | 8/1977 | Fed. Rep. of Germany | 310/361 |
| 2338607 | of 0000 | France . | |
| 2353997 | of 0000 | France . | |
| 2336806 | of 0000 | France . | |
| 911761 | 7/1946 | France . | |
| 953895 | 12/1949 | France . | |
| 5398793 | of 0000 | Japan . | |
| 5375892 | of 0000 | Japan . | |
| 5291678 | of 0000 | Japan . | |
| 578803 | of 0000 | Switzerland . | |
| 513471 | 5/1976 | U.S.S.R. | 310/344 |

*Primary Examiner*—Mark O. Budd
*Attorney, Agent, or Firm*—Griffin, Branigan & Butler

[57] ABSTRACT

The invention provides a piezoelectric bar resonator of small dimensions operating in the thickness shear mode and employing a minimum of separate and distinct elements. The resonating element 1 and its support 2 are blanked from a thin slab of piezoelectric material in a manner to provide a single piece of which the central portion forms the bar resonator and the peripheral portion constitutes a frame-work support. The two portions remain attached at at least one end of the bar. Planar or flattened cap type cover members 8 are fixed to frame 2. The invention may be applied where piezoelectric bar resonators of extremely small dimensions are required.

5 Claims, 7 Drawing Figures

HIGH FREQUENCY PIEZOELECTRIC RESONATOR

BACKGROUND OF THE INVENTION

This invention concerns high frequency piezoelectric resonators. For frequencies of one MHz and more such resonators generally comprise a resonating element in the form of a circular plate which may resonate in the thickness shear mode. Elements in the form of rectangular plates which are easier to manufacture have also been known for some time. Only the latter are considered in this case. These resonators operating in the thickness shear mode employ preferably the phenomenon known as energy trapping which concentrates the vibration in a central region of the piezoelectric plate, thus permitting the fastening of the latter by its edges or ends to a support which is fixed to a container, all of this for a minimum energy loss. Such fastening may be effected by means of solder or glue. The casing appears most often in the form of an encapsulation or glass bulb provided with metalic traverses or a metallic capsule likewise equipped with metallic traverses, these in such case however being insulated from the remainder of the capsule by glass beads or ceramic-to-metal bondings.

In order to assure good performance, resonators of high quality are hermetically sealed within a capsule and generally under vacuum in order to shelter them from all forms of contamination and to eliminate or limit the losses of energy due to the presence of air. In such case the electric traverses must likewise be sealed and this introduces numerous problems.

When for certain applications it becomes of greatest importance to reduce to the greatest possible degree the overall dimensions of the resonator the problems raised by the fixing of the plate to its support and by the sealed traverses become overwhelming and insurmountable obstacles appear quickly, owing to the fact that the limits of known technology have been reached. In particular for resonators which must operate under vacuum the very small interior volume requires not only an absolute or almost absolute sealing in order to maintain performances duing several years, but also requires a heat treatment of the components before sealing, in order to avoid subsequent gas emissions from the surfaces at the interior of the evacuated enclosure. This heat treatment must be effected likewise under vacuum and at relatively high temperatures, the time period therefor being reduced as the temperature is raised. Evidently the maximum temperature limit which may be withstood without damage by the solder and glues for assembling the unit is soon reached.

SUMMARY OF THE INVENTION

The present invention has as its object to overcome these difficulties and propose to this effect a piezoelectric resonator in the form of a plate or rectangular bar operating in the thickness shear mode comprising a minimum of distinct components capable of being realized in very reduced dimensions and for which the machining as well as the assembly are clearly simplified over methods known to the prior art.

DETAILED DESCRIPTION OF THE INVENTION

Figure 1:
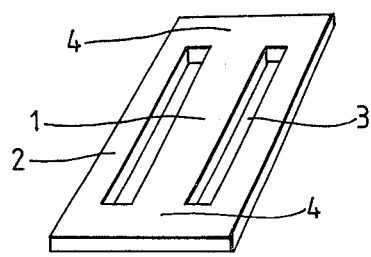
FIGS. 1 and 2 represent at two different stages of realisation a resonating element and its support according to the invention.

FIG. 1 shows a resonating element according to the invention. It is obtained through simple blanking in a plate of piezoelectric material. Of generally rectangular form, it comprises two distinct elements at the same time being constituted by a single planar piece: a central portion in the form of bar 1 which is the resonating element and a peripheral portion 2 forming a frame completely surrounding bar 1 and separated from the latter along its longitudinal edges by slots 3. Slots 3 are such that bar 1 remains coupled to frame 2 by its ends 4 with no physical or mechanical discontinuity which thus constitute its support. Since bar 1 operates according to the thickness shear mode and uses the energy trapping phenomenon, the end zones 4 are not affected by the vibrations. Such zones 4 are thus neutral and coupling between bar 1 and the framework support 2 will not effect the performance of the resonator.

Figure 2:
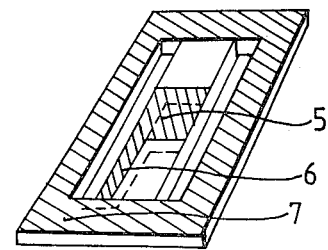

At a further stage of manufacture as shown in FIG. 2 a system of bipolar electrodes 5 is deposited on opposed faces of bar 1 in a well-known manner such as for example by vacuum deposition. The thickness of metallisation of electrodes 5 must comply to known rules in order that the energy trapping phenomenon be obtained in a satisfactory manner in view of the design criteria, that is to say, in manner such that the vibration zone is rigorously localized in a portion situated between electrodes 5 i.e. the median region of bar 1. The framework support 2 is then coated on both of its opposed faces by means of a perfectly adhering metallized layer 7 and is coupled by contact tracks to the corresponding pole of the electrode system 5.

Figure 3:
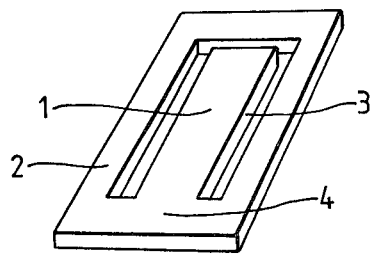
FIGS. 3 and 4 show a second mode of realisation in accordance with the invention.
Figure 4:
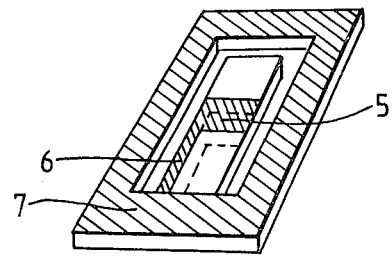

In a variant as shown in FIGS. 3 and 4, slot 3 surrounds the bar 1 on three of its sides in a manner whence the bar forms a cantilever coupled by one only of its ends 4 to frame 2. Such an arrangement may be employed without risk since the ends 4 of bar 1 are not affected by energy trapped thickness shear vibrations limited to within the median region of bar 1. Thus the coupling of the latter to the frame support 2 serves only to maintain the geometry of the assembly and to enable electrical connections. Thus a single extremity 4 integral with the supporting framework 2 is sufficient.

Figure 5:
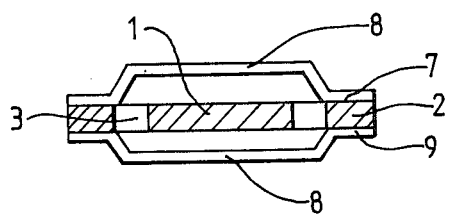
FIG. 5 is a sectional view of an encapsulated resonating element according to the invention.

Cover members 8 formed for example from sheet metal as flattened caps shown in FIG. 5 and in a manner to exhibit a peripheral lip 9, are brought into contact with each metallized layer 7 of the framework support 2 and along the entire periphery of the latter thus avoiding contact with bar 1. The fixing of cover members 8 on to frame support 2 in the case where these are metallic, as in the present example, may be effected by soldering or brazing or through use of a conductive glue or cement. When fastening is effected by soldering or brazing, metallized layer 7 will preferably be initially coated with an appropriate alloy by galvanic or silk-screening methods. The heat treatment of the assembly may then be carried out under vacuum at a temperature which will go beyond the melting point of the alloy and the assembly of the covers 8 to the framework 2 will be effected under vacuum or a neutral atmosphere by melting of the alloy and thus in a perfectly hermetic manner.

Figure 6:
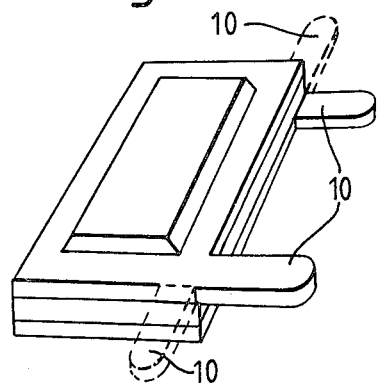
FIG. 6 is the representation of the resonator according to the invention in the form of a finished product.

Covers 8, in the case where these are metallic, may advantageously serve as hermetic connections or electrical connection terminals to the resonator. Thus as shown in FIG. 6, which shows the finished product constituting the resonator, the covers 8 may be provided with connection tabs 10 according to any known arrangement as for example that shown in dotted lines. Remaining portion of the encapsulation may be protected and insulated by means of a lacquer or a varnish.

Figure 7:
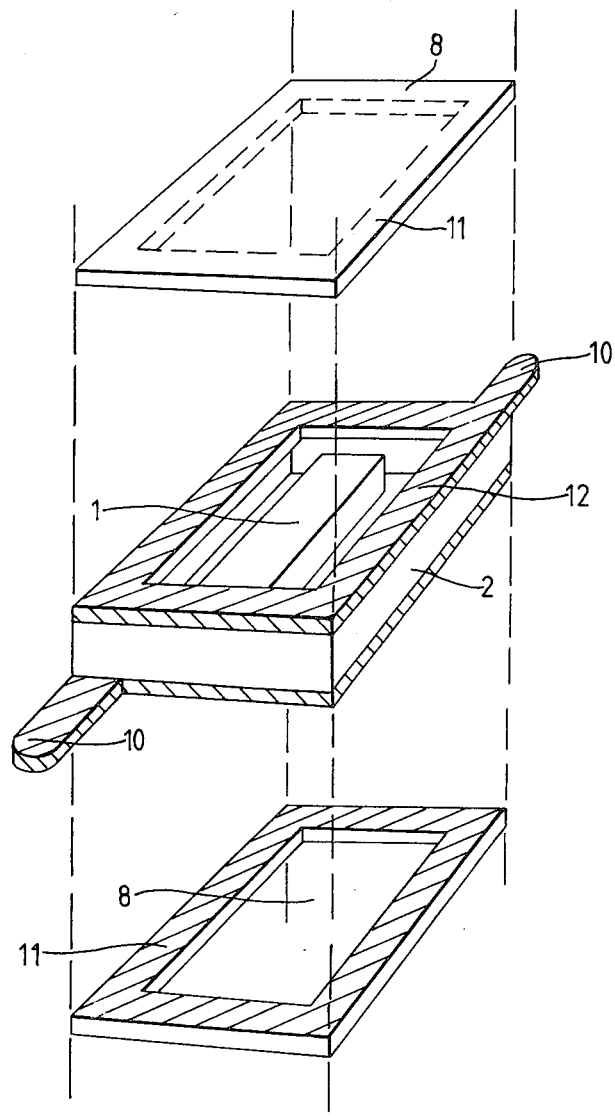
FIG. 7 is an exploded view of the resonator in accordance with a further variation of the invention.

A further example of the invention is illustrated in FIG. 7. In this case the metallic layer 12, carried by the frame support 2, is given a greater thickness in such a manner that it becomes possible to use cover members 8 which are planar and nevertheless avoid entering into contact with bar 1. Such cover members 8 may then be either metallic or of an insulating material such as glass, ceramic or quartz. In the latter cases each cover 8 is coated on one of its faces with a metallic layer 11 forming a frame. The thick layer 12 will, as in the preceding case, exhibit connection tabs 10 and the assembly will be completed as in the case of the metallic cap covers.

What we claim is:

1. Piezoelectric bar resonator adapted to vibrate in the thickness shear mode and employing the energy trapping pinciple, wherein a resonant element and a support therefor are blanked from a thin slab of piezoelectric material to form a single planar element of which the central portion comprises the resonant element in bar form and a surrounding portion forms a framework support, the two portions remaining attached to one another by at least one of the ends of the bar, and the upper and lower surfaces of the framework support being attached to first and second cover members at attaching zones that surround said central portion on opposite sides of said thin slab; wherein the cover members are of electrically insulating material, the framework support having on its upper and lower surfaces a thick metallic layer on which the cover members are supported, the metallic layers having externally projecting tabs serving as electrical connecting terminals to the resonator.

2. Piezoelectric bar resonator as in claim 1 wherein the cover members are in planar form executed in material such as glass ceramic or quartz and coated on one surface with an adhering metallic layer forming a frame.

3. A piezoelectric resonator in which a resonant element and a support therefor are blanked from a thin slab of piezoelectric material to form a single integral element of which a central portion comprises a resonator and a surrounding peripheral portion forms a framework support, the two portions remaining attached to one another, however, the upper and lower surfaces of the surrounding peripheral portion being metallized with a thickened metallized layer, said resonator further including electrodes mounted on opposite sides of the central portion which are respectively electrically attached to said thickened metallized layers on said upper and lower surfaces of said surrounding peripheral portion, said thickened metallized layers of said surrounding peripheral portion being substantially thicker than said electrodes and extending outwardly beyond said surrounding peripheral portion to form uncovered, outwardly protruding electricalconnection tabs for connecting leads to said electrodes; and separate cover members having metallic layers thereon attached to said metallized layers of said surrounding peripheral portion for enclosing said central portion.

4. A piezoelectric bar resonator as in claim 3 wherein said cover members are made of metal.

5. A piezoelectric bar resonator as in claim 3 wherein said cover members are made of an insulating material coated on one of its faces with a metallic layer for attaching to the metallic layer of said peripheral portion.

* * * * *